April 26, 1960 G. F. ABBOTT, JR 2,934,659

MONOSTABLE TRIGGER CIRCUIT

Filed Nov. 16, 1956

INVENTOR
G. F. ABBOTT, JR.
BY Harold C Herman
ATTORNEY

United States Patent Office 2,934,659

Patented Apr. 26, 1960

2,934,659

MONOSTABLE TRIGGER CIRCUIT

George F. Abbott, Jr., New York, N.Y., assignor to Bell Telephone Laboratories, Incorporated, New York, N.Y., a corporation of New York Application November 16, 1956, Serial No. 622,680

10 Claims. (Cl. 307—88.5)

This invention relates to trigger circuits and more particularly to monostable transistor trigger circuits.

A monostable trigger circuit has a single equilibrium condition to which it returns after being operated. There are essentially two types of transistors which are utilized in trigger circuits: point contact transistors which have a current amplification factor greater than 1; and junction transistors which have a current amplification factor less than 1. Both types of transistors have a base electrode, an emitter electrode and a collector electrode. The base electrode of the point contact transistor is in large area low resistance contact with a block of semiconductive material; whereas, the emitter and collector electrodes of a point contact transistor are in rectifying contact with the block of semiconductive material. The semiconductive material may be of the N type having an excess of electrons or of a P type having an excess of "holes." Junction transistors may be of the P–N–P type or of the N–P–N type having a single crystal with one type of material in the center and the other type on both sides. The base electrode of the junction transistor is connected to the central material and the emitter and collector electrodes are connected respectively to the ends or side material.

Transistors which have a current amplification factor greater than 1 lend themselves to trigger circuit applications. Such circuits are described, for example, in the Patent 2,579,336, issued to A. J. Rack on December 18, 1951 and in the Patent 2,831,983, issued to B. Ostendorf, Jr., on April 22, 1958. When a trigger circuit includes only one transistor, the current amplification factor of the transistor must be greater than 1 to provide for the trigger action. Single transistor trigger circuits therefore employ point contact transistors. When the high currents are to be handled, however, point contact transistors are not desirable as the rectifying contacts at the emitter and collector electrodes limit the current handling capacity of the transistor. Junction transistors can handle higher currents than point contact transistors but are not as fast.

It is the general object of this invention to provide a low cost fast operating monostable transistor trigger circuit which has a high-current handling capacity.

Another object of this invention is to provide a monostable trigger circuit which handles high currents without excessive dissipation.

Still another object of this invention is to provide a monostable transistor trigger circuit which provides an output pulse having a duration independent of load changes.

A further object of this invention is to provide a monostable trigger circuit which has an output pulse of constant magnitude.

These and other objects of the invention are attained in an illustrative embodiment of this invention wherein the monostable trigger circuit includes a grounded emitter junction transistor which is utilized as a buffer stage for a point contact transistor monostable stage. The base electrode of the junction transistor is coupled to the emitter electrode of the point contact transistor through a duration control capacitor. The capacitor is isolated from the load by the buffer stage so that load changes will not affect the rate of charging or discharging thereof.

A feature of this invention relates to the provision of a monostable transistor circuit having a point contact transistor which provides for the trigger action and a junction transistor which provides for the high-current handling capacity.

Another feature of this invention relates to means for providing an output pulse the duration of which is independent of load changes. This feature is achieved because the duration control capacitor is isolated from the load by the emitter buffer stage.

Excessive dissipation is avoided when large currents are handled by the trigger circuit because the output is supplied through the low emitter-to-collector impedance of the buffer stage and not through the point contact transistor or other relatively high impedance. Moreover, in order to restrict dissipation or power consumption when an output is not required, both transistors are nonconductive or turned off.

Still another feature of this invention relates to the provision of a trigger circuit which provides an output pulse of the same polarity as the input pulse to the monostable trigger circuit. In computer systems and the like, often only positive or negative pulses are utilized throughout the system. It is desirable in such systems to provide components, such as the monostable trigger circuit of the present invention, which supply an output pulse having the same polarity as the input pulse thereto.

A further feature of this invention relates to the provision of a monostable trigger circuit having a sensitivity independent of load changes. The trigger circuit sensitivity is independent of load changes because the buffer circuit attenuates input pulse leakage due to input overdrive. The overdrive appears at the emitter and collector electrodes of the point contact transistor but the connection of the buffer through the duration control capacitor to the emitter electrode of the point contact transistor functions to attenuate or to block leakage due to the overdrive to the load. The buffer circuit functions in this manner to isolate the load from the input trigger pulse.

A further feature of this invention pertains to means for providing an output pulse of constant magnitude. The potential at the collector of the point contact transistor decays exponentially under control of the duration control capacitor but the potential at the load is constant due to the isolating effect of the buffer stage.

Further objects and features will become apparent upon consideration of the following description taken in conjunction with the drawing wherein.

Figure 1:
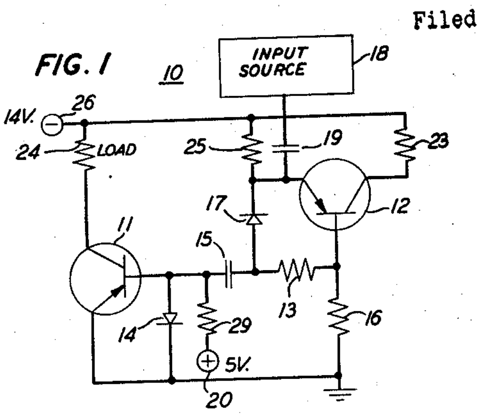
Fig. 1 is a circuit representation of the monostable transistor circuit of the present invention.

Referring to Fig. 1, the monostable trigger circuit 10 includes a P–N–P junction transistor 11 and an N type point contact transistor 12. The two transistors 11 and 12 assume the same conductive condition on or off at any given time. With the transistors 11 and 12 nonconductive or off, the potential at the emitter electrode of transistor 12 is determined by the biasing path from ground through the resistors 16 and 13, the varistor 17 and the resistor 25 to the minus 14-volt potential source 26. The current from ground through the biasing path to the source 26 is effective to reverse bias the emitter electrode of the transistor 12 with respect to its base electrode. The emitter electrode of transistor 12 is more negative than its base electrode essentially because of the voltage drop across the resistor 13.

Figure 2:
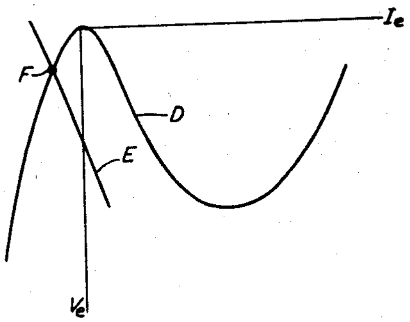
Fig. 2 is an input emitter characteristic and load line of a typical monostable stage utilized in the transistor circuit of the present invention.

The resistor 16, which is connected between the base electrode of transistor 12 and ground, functions together with the point contact transistor 12 to provide for a negative resistance characteristic which is illustrated as curve D in Fig. 2. The base current of transistor 12 is the algebraic sum of its emitter and collector currents and, since the collector current is negative and larger in magnitude than the emitter current when transistor 12 is triggered, the base current is therefore positive. When the transistor 12 is triggered or set, a positive emitter current therefore results in a positive base current. The positive base current through the base resistor 16 causes the base electrode to become more negative with respect to the emitter electrode. As the base electrode becomes more negative with respect to the emitter electrode, the emitter current is further increased inducing an even larger positive base current. It is this regenerative feedback which gives rise to the negative resistance characteristic or curve D shown in Fig. 2. It is the combination of the transistor 12 having a current amplification factor greater than 1 and a feedback promoting base resistor 16 which provide for the negative resistance characteristic D.

The emitter circuit of transistor 12 includes the biasing path or circuit, described above, from ground to source 26 and also the transistor 11. The parameters of the components in the emitter circuit are designed to have the emitter load line E intersect the negative resistance characteristic D at point F to provide for monostable operation. The single intersection of the load line E and the characteristic D provides for a low-current equilibrium condition at point F. In order to trigger the point contact transistor 12 from its off condition, the potential at its emitter electrode must be increased to a value over ground potential or over the knee of the negative resistance characteristic D. As is hereinafter described, the increase of emitter potential is provided for by a set or turn-on pulse, illustrated in curve G of Fig. 3.

The junction transistor 11 is nonconductive when the transistor 12 is nonconductive because the base electrode of transistor 11 is normally positive with respect to its emitter electrode. The base electrode of the transistor 11 is normally positive with respect to the emitter electrode of transistor 11 because of a biasing path from a plus 5-volt potential source 20 through a resistor 29 and a silicon junction varistor 14 to ground. The silicon junction varistor 14 is connected between the base and emitter electrodes of transistor 11. The small nearly constant voltage drop across the silicon junction varistor 14 serves to bias the emitter electrode of transistor 11 with respect to its base electrode. Varistor 14 is utilized instead of a resistor in order to reduce the recharge time of a capacitor 15 which connects the base electrode of transistor 11 to the junction of varistor 17 and resistor 13.

Figure 3:
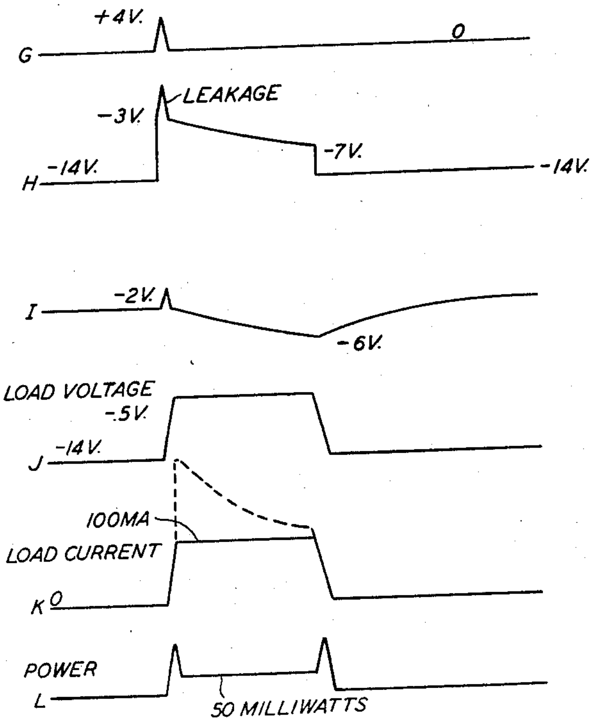
Fig. 3 is a series of curves illustrating the operation of the monostable transistor circuit shown in Fig. 1.

The input pulse, shown in curve G of Fig. 3, is provided from source 18 through a coupling capacitor 19 to the emitter electrode of transistor 12. When the potential increase at the emitter electrode of the transistor 12, its emitter-to-base junction becomes forward biased. When the emitter-to-base junction of transistor 12 becomes forward biased, a leakage pulse shown in curve H of Fig. 3 appears at its collector electrode which is connected through a resistor 23 to the source 26. The input or turn-on pulse overdrives the emitter-to-base junction of the transistor 12 to provide for a leakage pulse at its collector electrode because it is substantially impossible to provide a turn-on pulse which has a magnitude exactly equal to the necessary minimum for turning on a transistor. Moreover, the rise time or reaction time of a transistor is considerably improved if it is driven to its high-current equilibrium condition by a large input pulse. The rise of collector current in a point contact transistor is the result of the presence of minority carriers (holes injected at the emitter electrode for N type transistors) in the immediate neighborhood of the collector electrode. The minority carriers take a finite length of time to travel from the emitter electrode to the collector electrode and account for a time delay of the output pulse with respect to the input pulse. The reason for this delay is that all minority carriers do not take the same path in traveling from the emitter electrode to the collector electrode because of the geometry of the transistor and the collisions the minority carriers suffer in traveling through the crystal. The minority carriers injected into the emitter electrode at the initiation of the input pulse do not therefore arrive at the collector electrode at the same time. This time spread or delay accounts for the rise in time or delay of the output pulse with respect to the input pulse. In order to provide for a minimum rise time a large input pulse is provided to overdrive the emitter-to-base junction.

If speed, or turn-on time, is not critical a pair of junction transistors may be utilized instead of the point contact transistor 12 in the monostable stage. The manner of interconnecting two junction transistors to function as a point contact transistor is disclosed in the Patent 2,655,609, which issued to W. Shockley on October 13, 1953.

When the transistor 12 is turned on, it also functions to turn on the transistor 11 which serves as a suffer stage between a load resistor 24 and the monostable trigger stage including the transistor 12. As described above, the junction of varistor 17 and resistor 13 is connected through the capacitor 15 to the base electrode of the transistor 11. The varistor 17 prevents the shunting of the positive input pulse through the capacitor 15 and varistor 14 to ground. If the timing capacitor 15 is connected directly to the emitter electrode of transistor 12 instead of through the varistor 17, the input pulse would be ineffective to trigger the circuit 10 because of the shunt path offered to ground.

The overdrive leakage which appears at the collector electrode of transistor 12 does not appear at the collector electrode of transistor 11. The potential conditions at the collector electrode of transistor 11 are illustrated in curve J of Fig. 3. The overdrive does not result in a leakage pulse at the collector electrode of transistor 11 because any increase in potential at the base electrode of transistor 11 only tends to further reverse bias the emitter-to-base junction of transistor 11. Transistor 11 is turned on when the transistor 12 enters the negative resistance region of its characteristic D and the potential at the base electrode of transistor 11 falls below that of its emitter electrode. The overdrive results therefor in a leakage pulse at the collector electrode of the point contact transistor 12 as depicted in curve H in Fig. 3 but not at the collector electrode of the transistor 11 as depicted in curve J of Fig. 3.

When transistor 11 is turned on, it supplies the load current, shown in curve K of Fig. 3, through its low impedance emitter-to-collector path to resistor 24. Excessive dissipation is avoided as none of the load current is through the point contact transistor or the higher impedance base-to-collector path of the junction transistor. As shown in Fig. 3, curve L, the power dissipation of transistor 11 is very low when the transistor 11 is on. The voltage drop across the emitter-to-collector junction to transistor 11 is only approximately .5 volt when 100 milliamperes are provided through the load resistor 24 so that the dissipation is 50 milliwatts. When transistor 12 is turned on it presents a very low impedance in the base-to-emitter circuit of transistor 11. The capacitor 15 moreover also functions to rapidly transmit the voltage pulse from the transistor 12 to the transistor 11. The high speed trigger stage including transistor 12 functions therefore to drive the buffer stage including transistor 11. The point contact transistor 12 is utilized in the monostable trigger stage first because the transistor must have a current amplification factor greater than 1 to provide for the trigger action and secondly because the point contact transistor is faster than the junction transistor. By rapidly reducing the impedance connected to the base electrode of transistor 11, transistor 11 is overdriven or rapidly triggered.

The pulse provided to the load resistor 24 is positive or of the same polarity as the input pulse from the source 18. As shown in curve J, Fig. 3, when transistor 11 is triggered the potential at its collector electrode changes from minus 14 volts to minus .5 volt. The pulse which appears at the capacitor 15 is of the opposite polarity as that of the input pulse because, as shown in curve I of Fig. 3, the potential changes from minus 2 volts to minus 6 volts when the transistor 12 is triggered. By connecting the buffer stage through the capacitor 15 and varistor 17 to the emitter electrode of transistor 12, the phase reversal provided by transistor 11 results in an output pulse of the same polarity as the input or set pulse from the source 18.

When the trigger circuit 10 is turned on, it automatically restores to its single equilibrium condition under control of the capacitor 15. The duration of the output pulse provided to the load 24 is dependent upon the rate of charging the capacitor 15. Capacitor 15, as described above, is connected between the resistor 29 and the junction of varistor 17 and resistor 13. When the transistors 11 and 12 are turned on, the impedance presented to the capacitor 15 consists essentially of the resistor 23 in parallel with the resistor 25 and also in parallel with the resistor 16 because the transistor 12 may be considered essentially as a short circuit when it is turned on. The effect of the load 24 on the impedance presented to the capacitor 15 is negligible because the emitter-to-base path of transistor 11 short-circuits the load when transistor 11 is saturated. It is evident, therefore, that changes in the load do not affect either the impedances presented to the capacitor 15 or the duration of the output pulse. By connecting the transistor 11 as a buffer between the duration control capacitor 15 and the load 24, changes in impedance of the load 24 do not affect the rate of charging or discharging the capacitor 15.

The output pulse provided to the load resistor 24 is flat as illustrated in curves J and K of Fig. 3. The output pulse is flat because the transistor 11 is saturated as long as the transistor 12 is turned on. The pulses which appear at the collector and emitter electrodes of transistor 12 are exponential as shown in curves I and H in Fig. 3 and the maximum available load current, which is shown as a dash curve in curve K of Fig. 3, is also exponential. The load current is determined by the magnitude of the load impedance, represented by the load resistor 24. The output pulse is flat as long as the load current is less than a value equal to $$\frac{\alpha}{1-\alpha}I_b$$

where $\alpha$ is the current amplification factor of transistor 11 and $I_b$ is the base current of transistor 11. For a relatively large current amplification factor, a flat pulse having a magnitude greater than 100 milliamperes can be provided. The maximum available load current is exponential because the base current of transistor 11 changes exponentially under control of the capacitor 15.

By coupling the buffer transistor 11 through the duration control capacitor 15 to the emitter electrode of transistor 12, a flat output pulse of constant duration independent of load changes is, in this manner, provided. When the transistor 12 turns off, the capacitor 15 discharges to turn off the transistor 11. Transistor 11 turns off because the potential at its base electrode increases to plus 5 volts when the transistor 12 becomes nonconductive to reverse bias its emitter-to-base junction.

The circuit 10 may be triggered again in a relatively short time because of the effect of the varistor 14. The varistor 14 allows the capacitor 15 to rapidly discharge to ready the circuit 10. The pulse repetition rate is in this manner increased by utilizing a varistor instead of a resistor to bias the transistor 11.

In an illustrative embodiment of this invention circuit parameters are as follows:

| | |
|---|---|
| Resistor 13 | 1500 ohms. |
| Battery 20 | plus 5 volts. |
| Resistor 16 | 1800 ohms. |
| Capacitor 19 | 1500 micromicrofarads. |
| Resistor 23 | 1620 ohms. |
| Resistor 24 | 500 ohms. |
| Battery 26 | minus 14 volts. |
| Capacitor 15 | .01–1 microfarad, depending upon the desired pulse duration. |
| Resistor 29 | 5000 ohms. |
| Resistor 25 | 15,000 ohms. |

It is to be understood that the above-described arrangement is illustrative of the application of the principles of this invention. Numerous other arrangements may be devised, as, for example, the magnitude of the circuit parameters and current and potential conditions may be changed. It is evident therefore that other arrangements may be devised by those skilled in the art without departing from the spirit and scope of the invention.

What is claimed is:

1. A monostable trigger circuit comprising a point contact transistor having a semiconductive body and emitter, base and collector electrodes connected to said body, means connected to said collector electrode to supply an operational potential, a feedback promoting impedance connected to said base electrode, a buffer stage for maintaining pulse duration independent of load changes, said buffer stage including a junction transistor having a semiconductor body and emitter, base and collector electrodes connected to said body, duration control means connected to said emitter electrode of said point contact transistor and said base electrode of said junction transistor to determine the duration of pulses provided by said circuit, a biasing source connected to said base electrode and said emitter electrode of said junction transistor, and load means connected to said collector electrode of said junction transistor.

2. A trigger circuit comprising a point contact transistor including base, collector and emitter electrodes, a feedback promoting impedance element connected to said base electrode, means for biasing said emitter electrode with respect to said base electrode, means connected to said collector electrode to supply an operational potential, an output terminal, and circuit means connected between said emitter electrode and said output terminal, said circuit means including a capacitor connected to said emitter electrode to control the duration of operation of said trigger circuit, a junction transistor having base, emitter and collector electrodes, means connecting said base electrode of said junction transistor to said capacitor, and means connecting said collector electrode of said junction transistor to said output terminal.

3. A monostable trigger circuit comprising a point contact transistor having a semiconductor body and emitter, base and collector electrodes connected to said body, a biasing circuit connected to said base and emitter electrodes of said point contact transistor, a capacitor connected to said emitter electrode of said point contact transistor for controlling the output pulse duration of said trigger circuit, a feedback promoting impedance connected to said base electrode of said point contact transistor, a voltage source connected to said collector electrode of said point contact transistor, means for supplying an input pulse to said emitter electrode of said point contact transistor, said biasing circuit including a varistor connected between said emitter capacitor and said emitter electrode of said point contact transistor to block the passage of said input pulse to said capacitor, an output terminal, and a buffer stage connected between said output terminal and said emitter capacitor, said buffer stage including a junction transistor having a semiconductor body and emitter, base and collector electrodes connected to said body, means connecting said emitter capacitor to said base electrode of said junction transistor, a biasing source connected to said base and said emitter electrodes of said junction transistor, and means connecting said collector electrode of said junction transistor to said output terminal.

4. A monostable trigger circuit comprising a point contact transistor having a semiconductor body and emitter, base and collector electrodes connected to said body, a biasing circuit connected to said base and emitter electrodes of said point contact transistor, a capacitor connected to said emitter electrode of said point contact transistor for controlling the output pulse duration of said trigger circuit, a feedback promoting impedance connected to said base electrode of said point contact transistor, a voltage source connected to said collector electrode of said point contact transistor, means for supplying an input pulse to said emitter electrode of said point contact transistor, said biasing circuit including a varistor connected between said emitter capacitor and said emitter electrode of said point contact transistor to block the passage of said input pulse to said capacitor, an output terminal, a buffer stage connected between said output terminal and said emitter capacitor, said buffer stage including a junction transistor having a semiconductor body and emitter, base and collector electrodes in contact with said body, means connecting said base electrode of said junction transistor to said emitter capacitor, means connecting said collector electrode of said junction transistor to said output terminal, and a biasing circuit for said junction transistor having a varistor connected between said base and emitter electrodes of said junction transistor.

5. In combination, a load, and a monostable trigger circuit to provide to said load flat output pulses having a duration independent of load changes, said circuit comprising a point contact transistor having base, emitter and collector electrodes, a voltage source connected to said collector electrode, a feedback promoting impedance element connected to said base electrode, a biasing circuit connected to said base and emitter electrodes of said point contact transistor, a duration control capacitor connected to said biasing circuit, a junction transistor connected between said load and said capacitor, said junction transistor having a collector electrode connected to said load, a base electrode connected to said capacitor, and an emitter electrode, and a biasing circuit for said junction transistor connected to said base and said emitter electrodes thereof.

6. In combination, first transistor means including base, emitter and collector connections, a feed-back promoting impedance element connected to said base connection, a source of input pulses connected to said emitter connection, biasing means for said first transistor means connected to said base, emitter and collector connections, said biasing means including a varistor connected to said emitter connection, a duration control capacitor connected to said varistor, and a buffer stage connector to said capacitor, said buffer stage including second transistor means having base, emitter and collector connections, said capacitor being arranged between said base connection of said second transistor means and said varistor, said varistor being so arranged as to be effective to block the passage of said input pulses to said control capacitor, and biasing means for said second transistor means connected to said base, emitter, and collector connections.

7. A monostable circuit comprising a point contact transistor having a current multiplication factor greater than one, said point contact transistor having an emitter, base, and collector electrode, means including a feedback promoting impedance connected to said base electrode to provide with said point contact transistor a low current and a high current state of operation, means connected to said collector electrode to provide an operational potential thereto, a current path for said emitter electrode including a capacitive device to control the operation of said point contact transistor in said high current state, a junction transistor having an emitter-collector circuit and an emitter-base circuit, output means including a voltage source and a load device connected to said emitter-collector circuit, means connected to said emitter-base circuit to supply a reverse biasing voltage thereto, and means responsive to current flow in said emitter current path to forward bias said emitter-base circuit of said junction transistor during the operation of said point contact transistor in said high current state.

8. A monostable circuit comprising a point contact transistor having emitter, base and collector electrodes, means including a feedback promoting impedance connected to said base electrode to provide with said point contact transistor a low current stable state and a high current unstable state of operation, means connected to said collector electrode to provide an operational potential, a current path connected to said emitter electrode and including a capacitive device effective to control the operation of said point contact transistor in said high current state, input means effective to transfer said point contact transistor from said low current state to said high current state, a junction transistor having an emitter-collector circuit and an emitter-base circuit, said junction transistor having a conducting and a nonconducting state of operation, biasing means for maintaining said emitter-base circuit in a reverse biased condition including a unilateral device connected in a parallel circuit arrangement with said emitter-base circuit and poled in a direction of positive emitter current, means connecting said capacitive device in a series circuit arrangement with said emitter-base path of said junction transistor, and an output circuit connected to said emitter-collector circuit.

9. A monostable circuit comprising a point contact transistor having an emitter, collector and base electrode, means including a feedback promoting impedance connected to said base electrode to provide with said point contact transistor a low current stable state and a high current unstable state of operation, biasing means including a first potential source connected to said emitter electrode of said point contact transistor, means connected to said collector electrode to supply an operating potential thereto, input means connected to said emitter electrode of said point contact transistor and operative to transfer said point contact transistor from said low current state to said high current state, a junction transistor having an emitter-collector circuit and an emitter-base circuit, an output circuit including a voltage source and a load device connected to said emitter-collector circuit, biasing means to maintain said emitter-base circuit in a reverse biased state and including a second potential source and a first unilateral conducting device each arranged in parallel with said emitter-base circuit, said unilateral device poled in a direction of positive emitter current of said junction transistor, a current path for said emitter electrode of said point contact transistor, said current path including a capacitive device and a second unilateral conducting device, said second unilateral device being poled in a direction of positive emitter current of said point contact transistor and intermediate said emitter electrode and said capacitive device, and conductive means connecting said emitter-base circuit to said current path.

10. A monostable circuit comprising a point contact transistor having emitter, base and collector electrodes, means including a feedback promoting impedance connected to said base electrode to provide with said point contact transistor a low current stable state and a high current unstable state of operation, means connected to said collector electrode to supply an operational potential thereto, means including a source of input pulses connected to said emitter electrode to transfer said point contact transistor from said low current state to said high current state, a junction transistor having an emitter-base circuit and an emitter-collector circuit, said junction transistor having a conductive and a nonconductive state of operation, an output device connected to said emitter-collector circuit of said junction transistor, biasing means connected to said emitter-base circuit for maintaining said junction transistor in said nonconductive state, and a current path connected to said emitter electrode of said point contact transistor including a capacitive device serially arranged with said emitter-base circuit of said junction transistor so that the operation of said point contact transistor in said high current state will cause current flow through said emitter-base circuit of said junction transistor, said capacitive device being connected between said emitter-base circuit of said junction transistor and said emitter electrode of said point contact transistor and effective to control the operation of said point contact transistor in said high current state.

References Cited in the file of this patent

UNITED STATES PATENTS

| | | |
|---|---|---|
| 2,622,212 | Anderson | Dec. 16, 1952 |
| 2,663,800 | Herzog | Dec. 22, 1953 |
| 2,730,576 | Caruthers | Jan. 10, 1956 |
| 2,761,965 | Dickinson | Sept. 4, 1956 |
| 2,824,287 | Green et al. | Feb. 18, 1958 |
| 2,831,983 | Ostendorf | Apr. 22, 1958 |

FOREIGN PATENTS

| | | |
|---|---|---|
| 1,081,207 | France | June 9, 1954 |
| 1,114,488 | France | Dec. 19, 1955 |
| 1,122,426 | France | May 22, 1956 |